(12) United States Patent
Mori et al.

(10) Patent No.: US 6,218,609 B1
(45) Date of Patent: Apr. 17, 2001

(54) SOLAR-CELL MODULE, PROCESS FOR ITS PRODUCTION, METHOD FOR ITS INSTALLATION, AND ELECTRICITY GENERATION SYSTEM MAKING USE OF SOLAR-CELL MODULE

(75) Inventors: Masahiro Mori, Soraku-gun; Akiharu Takabayashi, Nara; Takeshi Takada, Kyotanabe; Ayako Komori, Joyo; Masaaki Matsushita, Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/286,424

(22) Filed: Apr. 6, 1999

(30) Foreign Application Priority Data

Apr. 6, 1998 (JP) .................................. 10-108449
Apr. 2, 1999 (JP) .................................. 11-096028

(51) Int. Cl.⁷ .................................................. H01L 31/048
(52) U.S. Cl. ......................... 136/259; 136/244; 136/252
(58) Field of Search ................................... 136/244, 256, 136/251, 259, 252; 126/621, 622, 623; 52/173.3

(56) References Cited

U.S. PATENT DOCUMENTS

| | | | |
|---|---|---|---|
| 4,315,163 | * | 2/1982 | Bienville .................................. 307/66 |
| 5,409,549 | * | 4/1995 | Mori ...................................... 136/244 |
| 5,530,264 | * | 6/1996 | Kataoka et al. ......................... 257/40 |
| 5,583,057 | * | 12/1996 | Inoue ........................................ 437/2 |
| 5,597,422 | * | 1/1997 | Kataoka et al. ....................... 136/259 |
| 5,651,837 | * | 7/1997 | Ohtsuka et al. ....................... 136/251 |
| 5,707,459 | * | 1/1998 | Itoyama et al. ....................... 136/251 |
| 5,849,107 | * | 12/1998 | Itoyama et al. ....................... 136/248 |
| 5,998,729 | * | 12/1999 | Shiomi et al. ........................ 136/251 |

FOREIGN PATENT DOCUMENTS

| | | | |
|---|---|---|---|
| 5-121773 | | 5/1993 | (JP) . |
| 10-341031 | * | 4/1998 | (JP) ................................ H01L/1/30 |
| 5-121773 | * | 4/1998 | (JP) ............................. H01L/31/042 |

* cited by examiner

*Primary Examiner*—Nasser Ahmad
*Assistant Examiner*—Michael C. Miggins
(74) *Attorney, Agent, or Firm*—Fitzpatrick, Cella, Harper & Scinto

(57) ABSTRACT

A solar-cell module having a photovoltaic device, a reinforcing sheet for reinforcing the photovoltaic device and a covering material which seals the photovoltaic device on the reinforcing sheet is bent at a region between the border of the photovoltaic device and the outer edge of the reinforcing sheet, where the reinforcing sheet is covered with the covering material at the part extending from the border of the photovoltaic device up to the bent portion closest thereto, or the covering material is, at the margin thereof, made to have a thickness cross-sectionally smaller as it extends farther from the border of the photovoltaic device, provided that the reinforcing sheet is not covered at the outward margin thereof with the covering material. The covering material which covers the photovoltaic device of the solar-cell module is peel-resistant.

30 Claims, 7 Drawing Sheets

SOLAR-CELL MODULE, PROCESS FOR ITS PRODUCTION, METHOD FOR ITS INSTALLATION, AND ELECTRICITY GENERATION SYSTEM MAKING USE OF SOLAR-CELL MODULE

BACKGROUND OF THE INVENTION

1. Field of the Invention

This invention relates to a solar-cell module, and more particularly to a solar-cell module whose reinforcing sheet has been bent, a process for its production, a method for its installation, and an electricity generation system making use of the solar-cell module.

2. Related Background Art

Solar cells have widely been used as clean and inexhaustible energy supply sources, and various research and development has been made in this area. In addition, development is energetically made on solar-cell modules well adapted to be installed on the ground, the roof and so forth.

Such solar-cell modules have begun to be used for various purposes, and with each situation, there are various demands.

One such demand is a solar-cell module making use of a back reinforcing sheet on the back of a solar-cell module. This back reinforcing sheet is bent or perforated so that the solar-cell module can be attached by utilizing the bent or perforated part.

As an example thereof, there is a solar-cell module employing a metallic reinforcing sheet as the back reinforcing sheet, which back reinforcing sheet is bent so that the solar-cell module may be more adaptable than ever to the installation of metallic roof materials.

As an example of this solar-cell module, a technique disclosed in Japanese Patent Application Laid-Open No. 5-121773 is known in the art. This solar-cell module has a metallic reinforcing sheet on the back of the light-receiving side. A photovoltaic device is mounted at the middle of this reinforcing sheet, the photovoltaic device is sealed with a covering material transparent resin, and the metallic reinforcing sheet is bent at its uncovered outer sides (bent portions are not covered with the covering material) so that the bent portions can be utilized to fix the solar-cell module upon installation.

Such a solar-cell module, however, has had a problem that the covering material tends to come off. In such a case, the covering material begins to come off from the margin and may gradually further come off until it comes off at its part directly sealing the photovoltaic device. If this occurs, the photovoltaic device may become detached from the reinforcing sheet and may become greatly damaged, resulting in a great lowering of electrical performance in some cases. Also, even if the covering material does not come off to the extent that the photovoltaic device becomes detached from the reinforcing sheet, water may enter the structure and contact the photovoltaic device to cause a great lowering of electrical performance. Thus, it is a great problem that the covering material comes off as stated above.

Under existing circumstances, however, no solar-cell module has been developed in which the covering material is peel-resistant and the photovoltaic device is protected from damage.

SUMMARY OF THE INVENTION

The present invention was made taking account of the above problems the prior art has had. Accordingly, an object of the present invention is to provide a solar-cell module whose covering material which covers the photovoltaic device of the solar-cell module does not come off from its margins.

The present invention solves the above problems.

First, it is important that the covering material is provided in the manner it does not cover the margin of the reinforcing sheet so that the covering material does not come off or become damaged at the margin of the reinforcing sheet. Taking only such a measure, however, is insufficient as in the above prior art. Once the covering material has begun to come off, it may gradually come off more and more until it comes off up to the part of the photovoltaic device.

Accordingly, the inventors have though of a measure which must be taken so that a covering material having begun to come off can be prevented from further coming off, and have employed the following means so that the intended effect can be attained and the above problems can be solved.

That is, as a first embodiment, the present invention provides a solar-cell module comprising a photovoltaic device, a reinforcing sheet for reinforcing the photovoltaic device and a covering material which seals the photovoltaic device on the reinforcing sheet, wherein;

the reinforcing sheet has at least a portion worked by bending, in its region extending from the border of the photovoltaic device on a photovoltaic device mounting area to the margin of the reinforcing sheet, and in that region the reinforcing sheet is covered with the covering material at the part extending from the border of the photovoltaic device toward the margin of the reinforcing sheet so far as it extends over the portion worked by bending, and is not covered at the margin thereof with the covering material.

As a second embodiment, the present invention provides a solar-cell module comprising a photovoltaic device, a reinforcing sheet for reinforcing the photovoltaic device and a covering material which seals the photovoltaic device on the reinforcing sheet, wherein;

the reinforcing sheet has at least a region extending from the border of the photovoltaic device on a photovoltaic device mounting area to the margin of the reinforcing sheet, and in that region the covering material is so bonded as to have at the margin thereof such a shape that the covering material has a thickness made cross-sectionally smaller toward the outer edge, and the reinforcing sheet is not covered at the outward margin thereof with the covering material.

The present invention-also provides a process for producing a solar-cell module having a photovoltaic device and a reinforcing sheet; the process comprising the steps of sealing the photovoltaic device with a covering material on the reinforcing sheet, and thereafter working the reinforcing sheet by means of a forming machine;

the covering material being provided only at the part the covering material is not damaged by the forming machine.

DETAILED DESCRIPTION OF THE PREFERRED EMBODIMENTS

Figure 1:
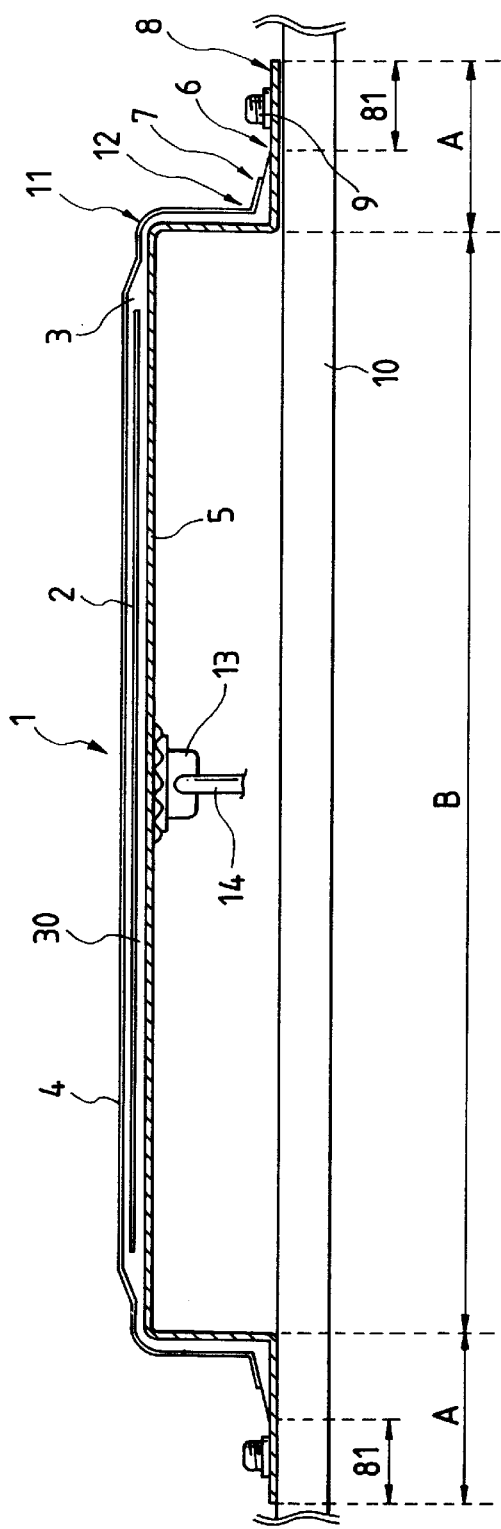
FIG. 1 is a diagrammatic cross-sectional view of a solar-cell module according to an embodiment of the present invention.

According to the first embodiment of the present invention, a solar-cell module comprises a photovoltaic device, a reinforcing sheet for reinforcing the photovoltaic device and a covering material which seals the photovoltaic device on the reinforcing sheet, and makes it conditions that;

the reinforcing sheet is not covered at the margin thereof with the covering material; and the reinforcing sheet has at least a portion worked by bending, in its region extending from the border of the photovoltaic device on a photovoltaic device mounting area to the margin of the reinforcing sheet, and in that region the reinforcing sheet is covered with the covering material at the part extending from the border of the photovoltaic device toward the margin of the reinforcing sheet so far as it extends over the portion worked by bending.

The solar-cell module satisfying such conditions functions as stated below.

First, since the margin of the reinforcing sheet is not covered with the covering material, even when the solar-cell module undergoes a mechanical load at its margin, only the margin of the reinforcing sheet undergoes the mechanical load and the margin of the covering material undergoes no load. Thus, it can be made less possible for the covering material to begin to come off.

Second, since the reinforcing sheet is worked by bending in its region extending from the border of the photovoltaic device to the margin of the reinforcing sheet and the covering material lies at the portion worked by bending, extending from the border of the photovoltaic device toward the outer edge, it follows that the flat portion holding the greater part of area of the reinforcing sheet and the part where the margin of the covering material lies do not lie on the same plane. Thus, even when the flat portion having a large area repeatedly undergoes expansion and contraction by heat, the margin of the covering material may less be affected by such expansion and contraction. This mechanism can briefly be explained as follows:

The reinforcing sheet and the covering material differ in coefficient of thermal expansion, and hence the reinforcing sheet and the covering material differ in the amount of displacement at their margins when they behave to expand or behave to contract. Here, both the reinforcing sheet and the covering material lie on the same plane, and have a small difference in the amount of displacement when this plane has a small area (or small length) but has a large difference in the amount of displacement when it has a large area (or large length). Because of this difference in the amount of displacement, a great peel stress is applied at the interface between the reinforcing sheet and the covering material. Thus, the structure as described above makes it less possible for the covering material to begin to come off because of this expansion and contraction by heat.

In addition, even if the covering material has begun to come off from its margin and has further come off, there is a great possibility that the portion worked by bending serves as a barrier against coming-off to make the covering material stop coming off any longer at that part. This is because, even through the covering material continues to undergo a peel stress to come off, such a stress is once released at the time the covering material has come off up to the bent portion. Once the peel stress has been released and the covering material has stopped coming off, a great stress is required in order for it to again begin to come off.

Cooperative action as stated above makes it less possible for the covering material to come off up to the part of the photovoltaic device. Thus, a solar-cell module having a high reliability can be obtained.

According to the second embodiment of the present invention, a solar-cell module comprises a photovoltaic device, a reinforcing sheet for reinforcing the photovoltaic device and a covering material which seals the photovoltaic device on the reinforcing sheet, and makes it conditions that;

the reinforcing sheet is not covered at the margin thereof with the covering material; and the reinforcing sheet has at least a region extending from the border of the photovoltaic device on a photovoltaic device mounting area to the margin of the reinforcing sheet, and in that region the covering material is so bonded as to have at the margin thereof such a shape that the covering material has a thickness made cross-sectionally smaller toward the outer edge.

The solar-cell module satisfying such conditions functions as stated below.

First, since the margin of the reinforcing sheet is not covered with the covering material, even when the solar-cell module undergoes a mechanical load at its margin, only the margin of the reinforcing sheet undergoes the mechanical load and the margin of the covering material undergoes no load. Thus, it can be made less possible for the covering material to begin to come off. Moreover, since the covering material is so bonded as to have at the margin thereof such a shape that the covering material has a thickness made cross-sectionally smaller toward the outer edge, its margin can be smooth and any peel force may hardly be applied thereto.

The solar-cell module can function as above more effectively when it has a small area of light-receiving surface where the photovoltaic device is disposed, and has a small amount of displacement ascribable to the expansion and contraction by heat.

In the above first and second embodiments, the margin of the covering material may preferably be so located as to lie at the position to be covered with the margin of a solar-cell module adjoiningly installed, or with a fixing member for solar-cell modules. This makes it hard for the covering material to begin to come off from the margin. In the state the solar-cell modules have been installed, the margin of each covering material is covered with the margin of each solar-cell module adjoiningly installed, or with a fixing member for solar-cell modules, and hence the covering material can be free from any mechanical load that may cause it to begin to come off. Moreover, in an instance where solar-cell modules are installed in such a way that the margin of each solar-cell module adjoiningly installed or the fixing member for solar-cell modules presses the margin of each covering material, even if the adhesion between the margin of the covering material and the reinforcing sheet has become lost and the covering material begins to come off, it may hardly further come off any longer because the covering material is kept pressed against the reinforcing sheet.

In the foregoing embodiments, the margin of the reinforcing sheet may preferably be bent foldedly at its part not covered with the covering material. This can make a marginal cut area of the reinforcing sheet stand inside the solar-cell module. For example, in an instance where the reinforcing sheet is a metallic sheet, even if the marginal cut areas have burrs having been made during working, the burrs are not present at the margin of the solar-cell module but hidden inside. Hence, there are advantages that, e.g., when someone touches the margin of the reinforcing sheet, he or she can be prevented from being injured by the burrs, and covering materials of adjoining solar-cell modules installed side by side can be prevented from being damaged.

In addition, since there is no covering material at the folded part, the covering material can be kept from being damaged by a forming machine when the folded part is formed. Moreover, the reinforcing sheet is severely worked by bending at the bending top of the folded part and a great stress is applied to the reinforcing sheet. Since, however, there is no covering material at that part, this stress is by no means applied thereto. Thus, a factor which makes the covering material begin to come off can be eliminated.

In the foregoing embodiments, the foldedly bent portion of the reinforcing sheet may preferably cover the margin of the covering material. This can prevent the covering material from beginning to come off.

Since the reinforcing sheet thus covers the margin of the covering material, any mechanical load applied to that margin and acting to make the covering material come off can be eliminated.

In an instance where the foldedly bent portion of the reinforcing sheet not only covers the margin of the covering material but also is bent in such a shape that it presses against the margin of the covering material, the covering material can mechanically be prevented from coming off.

In the above embodiments, the covering material may preferably comprise a resin film provided on the outermost surface and a transparent resin having the function to seal the photovoltaic device and bond it to the reinforcing sheet and also having an elasticity.

This can provide an elastic and soft covering material, which can be a covering material that may hardly be subject to mechanical damage and can absorb the expansion and contraction by heat. Hence, the covering material may hardly come off.

In this instance, as the transparent resin, a thermoplastic resin may be used. This enables employment of the solar-cell module production process described later, promising a convenience. It is a process in which materials for producing a solar-cell module are brought into close contact in a vacuum state, followed by melt adhesion in a heating furnace. Its basic principle has long been practiced and has technically been established. It enables manufacture without deviation from this basic principle, and has no problem on the production steps, having a high reliability.

When the solar-cell modules stands under a high temperature, the transparent resin becomes soft because of the high temperature and can absorb expansion by heat. This advantage is as stated above, thus what causes the covering material to begin to come off can be made as less as possible.

The transparent resin having an elasticity may preferably be provided in such a way that it extends beyond the margin of the resin film, and may preferably be bonded to the reinforcing sheet in such a shape that the thickness of the transparent resin at its margin becomes cross-sectionally smaller toward the outer edge. This is effective for making the covering material hard to begin to come off.

In the first place, since the resin film provided on the outermost surface stands adhered to the transparent resin in the state its margin lies on the inside of the margin of the transparent resin, any mechanical load acting to make it come off can be kept from being applied only to the margin of the resin film. Thus, since the margin of the resin film is bonded onto the elastic and soft transparent resin, it is very less possible that only the resin film acts to come off the transparent resin.

Second, since the transparent resin stands adhered to the reinforcing sheet in such a shape that the thickness of the transparent resin at its margin becomes cross-sectionally smaller toward the outer edge, there is an advantage that, even when any mechanical load acts to be applied to this margin, the margin can be smooth because of its cross-sectionally slant shape and any peel force may be applied thereto with difficulty.

In the above embodiments, the thickness of the covering material at its region outside the region where the photovoltaic device is disposed may preferably be smaller than the thickness of the covering material at its region where the photovoltaic device is disposed. This enables reduction of the quantity of the covering material used and can make the solar-cell module light-weight. There is an advantage that the cost for materials can be reduced.

In addition, when the reinforcing sheet is worked by bending, the bending stress applied to the covering material can be made small. When worked by bending, the thickness-direction center between the reinforcing sheet and the covering material which have been put together is the bending neutral face that undergoes no stress. Here, the reinforcing sheet undergoes a larger stress as the distance from the neutral face is larger (the thickness is larger). A large stress may result in break of the covering material when worked by bending. Residual stress may also be produced, bringing about a difficulty that the covering material is damaged as a result of changes with time. Hence, it is better for the covering material to have a smaller thickness. However, in view of its role to protect the photovoltaic device, the thickness of the covering material can not be made so small at the region where the photovoltaic device is disposed. Thus, it is greatly advantageous to provide the construction that the thickness of the covering material at its region outside the region where the photovoltaic device is disposed is smaller than the thickness of the covering material at its region where the photovoltaic device is disposed.

In the above embodiments, the reinforcing sheet may preferably be a sheet made of metal (metallic sheet). This makes it easy to form the solar-cell module by bending. The metallic sheet is one of materials most suited for plastic working. Such a technique of plastic working is a technique having long been studied and having been established. Hence, it is very useful because any forming machines for metallic sheets which are conventionally available in variety can be used as they are.

The metallic sheet also has a sufficient mechanical strength, and hence even a solar-cell module alone can be made to have a sufficient structural strength by bending it three-dimensionally into the solar-cell module.

The metallic sheet still also has a flexibility, and hence the solar-cell module can be installed and fixed in a curved state, making the module adaptable to various forms of installation.

In the above embodiments, the photovoltaic device may preferably be a photovoltaic device having a flexibility. This can keep the photovoltaic device from breaking even when a curving stress is applied to the solar-cell module when formed by bending. Accordingly, various forming processes can be carried out, making the module adaptable to various forms of installation.

The photovoltaic device can also be kept from breaking even when a curving stress is applied to the solar-cell module, e.g., a wind pressure is applied or someone steps on it, after the solar-cell module has been installed and fixed.

In the above embodiments, the solar-cell module may preferably be a construction material integral type solar-cell module. This can make the module simultaneously achieve both the role as a material construction and the role as a solar cell.

Its use as construction materials such as roofing materials and wall materials makes it unnecessary to additionally prepare any installation space for installing solar-cell modules or any members for fixing them. Thus, the installation space for installing roofing materials or wall materials and members for fixing them that are originally absolutely necessary can be used for those of solar-cell modules as they are.

In the solar-cell module production process of the present invention, which is a process for producing a solar-cell module having a photovoltaic device and a reinforcing sheet, the process comprises the steps of sealing the photovoltaic device with a covering material on the reinforcing sheet, and thereafter working the reinforcing sheet by means of a forming machine, and the covering material is provided only at the part the covering material is not damaged by the forming machine. This can prevent the covering material from being damaged to cause the covering material to begin to come off. If the covering material is damaged, e.g., the covering material is cut or peeled unwantedly, the covering material tends to begin to come off from that part as the start point.

In the solar-cell module production process of the present invention, the forming machine may preferably be a roll forming machine, and the covering material is provided only at the part the covering material is not damaged by the roll forming machine. This can be more effective in view of preventing the covering material from being damaged.

The roll forming machine is a machine by which a work material is worked by bending while being held and transported between rollers. Since the work material is rubbed while being pressed by the rollers, there is a high possibility that the covering material is damaged if it is there. In other forming machines, e.g., a machine called a "press break" in which a work material is bent while being put between a pair of molds moving up and down, the work material is not transported and hence is not rubbed while being pressed. Since in such a bending machine the work material is not worked while being transported, only work materials fit to the size of the working machine. can be worked for some reasons. By the way, nowadays, solar cells are being made large-sized in order to reduce operating cost for their installation. For such reasons, the roll forming machine is very useful as being adaptable to the bending in limitless size.

Thus, in the present invention, as a measure against such a roll forming machine which is very useful for forming solar-cell modules but has a high possibility of damaging covering materials and also against the bending machine such as a press break, the step of sealing the photovoltaic device is carried out in such a way that the covering material is always not provided at the part to be damaged. Hence, there can be no trouble of damaging the covering material.

Thus, as described above, a solar-cell module having a high quality and a high reliability can be obtained.

In the solar-cell module production process of the present invention, the reinforcing sheet may preferably have at its margin a side not covered with the covering material. This can provide the following functions.

In the first place, since the margin of the reinforcing sheet is not covered with the covering material, the covering material by no means undergoes any mechanical load which may make it come off, even when the margin of the reinforcing sheet is brought into contact with a member of the forming machine. Usually, in order to determine the size at the time of working, most forming machines employs a manner of butting a work material to a member of the roll forming machine. For example, in the case of the bending machine called a "press break", the margin of a work material is butted to a butt member in order to determine the position of bending. Also, in the case of the "roll forming machine", the margin of a work material rubs against a guide before the work material is put into a roller section. The margin of the work material is positionally regulated by a guide member so that the work material can be put straight into the roller section. At this stage, the margin rubs against the guide member. Moreover, at the stage it has entered the roller section, too, the first-stage roller is positionally adjusted by coming into contact with the margin of the work material. As stated above, when the solar-cell module is worked and formed by means of a forming machine, it is unavoidable for the margin of the reinforcing sheet to undergo a mechanical load, e.g., to rub against a member of the forming machine. In the present invention, however, since the margin of the reinforcing sheet is not covered with the covering material, the covering material by no means undergoes any mechanical load which may make it come off.

In addition, especially in the case of the "roll forming machine", if the covering material lies at the margin of the reinforcing sheet, the covering material is damaged by the rollers as stated above, and simultaneously a part of the covering material having been damaged and having come off may adhere to the rollers or may be rolled up therein.

If it occurs, a part of the covering material having thus come off may damage the "roll forming machine" or may be held between the rollers and the covering material to further damage the covering material greatly, bringing about a worse situation. In the present invention, however, since the margin of the reinforcing sheet is not covered with the covering material, such a situation can also be prevented.

Moreover, it is unnecessary to provide the step of cutting the covering material. Hitherto, when a solar-cell module having a covering material extending to cover the reinforcing sheet up to its margin is produced, the covering material protruding greatly from the margin of the reinforcing sheet is provided and is thereafter cut at its protrusion along the edge of the reinforcing sheet.

In the solar-cell module production process of the present invention, when formed by the forming machine, the reinforcing sheet covered with the covering material may preferably be worked by bending together with the covering material. This enables simplification of production steps. Until the step of sealing the solar-cell module with the covering material, the solar-cell module is not a spatial product having been bent but in a flat state. Hence, there are advantages that the production apparatus for sealing the photovoltaic device with the covering material may have a small size, and the solar-cell module in the course of production can be stored with ease.

In the solar-cell module production process of the present invention, the process may preferably have the step of sealing the photovoltaic device with the covering material while locating the covering material in such a way that its margin lies at the position to be covered with the margin of a solar-cell module adjoiningly installed, or with a fixing member for solar-cell modules. This can provide a solar-cell module which is hard for the covering material to begin to come off from the margin. In the state the solar-cell modules have been installed, the margin of each covering material is covered with the margin of each solar-cell module adjoiningly installed, or with a fixing member for solar-cell modules, and hence the covering material can be free from any mechanical load that may cause it to begin to come off.

Moreover, in an instance where solar-cell modules are installed in such a way that the margin of each solar-cell module adjoiningly installed or the fixing member for solar-cell modules presses the margin of each covering material, even if the adhesion between the margin of the covering material and the reinforcing sheet has become lost and the covering material begins to come off, it may hardly further come off any longer because the covering material is kept pressed against the reinforcing sheet.

In addition, since the photovoltaic device may only be sealed while keeping the condition that the margin of the covering material is located at the position to be covered with the margin of a solar-cell module adjoiningly installed, or with a fixing member for solar-cell modules, the position and dimension of the margin of the covering material can be set at large dimensional tolerance limits in many cases. Thus, no precise sealing step is required, enabling simplification of steps.

In the solar-cell module production process of the present invention, the process may preferably have the step of folding the margin of the reinforcing sheet at its part not covered with the covering material, by means of the forming machine. This can make it easy to form a folded part. The reason why the folded part is useful is as explained previously.

Thus, since the reinforcing sheet is folded at its part not covered with the covering material, this step makes it unnecessary to pay much attention not to damage the covering material, and can be carried out with great ease.

In solar-cell module production process of the present invention, the covering material may preferably comprise a resin film on the outermost surface and a transparent resin having the function to seal the photovoltaic device and make it adhere to the reinforcing sheet and also having an elasticity. This can provide a soft covering material so that any impact and stress can be absorbed even if part of the forming machine comes into contact with this covering material and the covering material can not easily be damaged. The forming machine is not required to be made not to come into contact with the covering material at all, and at most the former may be so designed as not to come into contact with the latter at a strong force. Thus, less labor may be taken therefor, and the type of the forming machine can be selected in a broader range, promising a great advantage.

As the transparent resin, a sheet material of thermoplastic resin may be used. This enables employment of the solar-cell module production process described later, promising a convenience. It is a process in which materials for producing a solar-cell module are brought into close contact in a vacuum state, followed by melt adhesion in a heating furnace. Its basic principle has long been practiced and has technically been established. It enables manufacture without deviation from this basic principle, and has no problem on the production steps, having a high reliability.

The transparent resin having an elasticity may preferably be provided in such a way that it extends beyond the margin of the resin film, and may preferably be bonded to the reinforcing sheet in such a shape that the thickness of the transparent resin at its margin becomes cross-sectionally smaller toward the outer edge. This makes very small the possibility that only the margin of the resin film is mechanically caught by part of the forming machine.

From the viewpoint of production steps, it is very easy to bond the transparent resin to the reinforcing sheet in such a shape that the thickness of the transparent resin at its margin becomes cross-sectionally smaller toward the outer edge. The covering material, photovoltaic device and reinforcing sheet are integrally sealed by the method described later, where the thickness can be made cross-sectionally smaller toward the outer edge without any special means.

In the solar-cell module production process of the present invention, in the step of sealing the photovoltaic device, a sheet material formed by integral lamination of the resin film and the transparent resin may preferably be used and it is preferable that the transparent resin and the resin film are dimensionally identical shape. And by heating the sheet material, the elastic transparent resin extends beyond the margin of the resin film, so that the elastic transparent provides such a shape that the thickness of the transparent resin at its margin becomes cross-sectionally smaller toward the outer edge. Moreover, since it is a sheet material formed by integral lamination of the resin film and the transparent resin, it can be handled with ease. Furthermore, since the resin film and the transparent resin are used in a dimensionally identical shape, they can be cut with ease.

In the step of sealing the photovoltaic device on the reinforcing sheet by the use of the covering material, the thickness of the covering material at its region outside the region where the photovoltaic device is disposed may preferably be smaller than the thickness of the covering material at its region where the photovoltaic device is disposed. This can make small the bending stress applied to the covering material when the reinforcing sheet is worked by bending.

When the reinforcing sheet is worked by bending, the thickness-direction center between the reinforcing sheet and the covering material which have been put together is the bending neutral face that undergoes no stress. Here, the reinforcing sheet undergoes a larger stress as the distance from the neutral face is larger (the thickness is larger). A large stress may result in break of the covering material when worked by bending. Residual stress may also be produced, bringing about a difficulty that the covering material is damaged as a result of changes with time. Hence, it is better for the covering material to have a smaller thickness. However, in view of its role to protect the photovoltaic device, the thickness of the covering material can not be made so small at the region where the photovoltaic device is disposed. Thus, it is greatly advantageous to provide the construction that the thickness of the covering material at its region outside the region where the photovoltaic device is disposed is smaller than the thickness of the covering material at its region where the photovoltaic device is disposed.

In the above process of the present invention, the reinforcing sheet may preferably be a sheet made of metal (or metallic sheet). This makes it easy to form the solar-cell module by bending. The metallic sheet is one of materials most suited for plastic working. Such a technique of plastic working is a technique having long been studied and having been established. Hence, it is very useful because any forming machines for metallic sheets which are conventionally available in variety can be used as they are.

The photovoltaic device may preferably be a photovoltaic device having a flexibility. This can, keep the photovoltaic device from breaking even when a curving stress is applied to the solar-cell module when formed by bending. Accordingly, various forming processes can be carried out, making the module adaptable to various forms of installation.

The solar-cell module may preferably be produced as a construction material integral type solar-cell module. This brings about the many advantages as stated previously. Also, there are additional advantages that, in the manufacture, any forming machines can be used which have already been made available in the world in order to produce construction materials, and such forming machines are available at a low price.

The method of installing solar-cell modules according to the present invention comprises fixing the solar-cell module according to the first or second embodiment to a stand or a roofing board by means of a fixing member and joining solar-cell modules adjoining to each other, both by utilizing the portion worked by bending. This enables easier and firmer fixing than the fixing of flat type solar-cell modules.

In the above method, the solar-cell module may preferably be fixed in such a way that the margin of the covering material is covered with the margin of the solar-cell module or the fixing member. This can make small the factor which makes the covering material begin to come off during actual use, because, although the margin of the covering material is not covered with when the solar-cell module is produced, it is covered after installation.

In the above method, the solar-cell module may preferably be a construction material integral type solar-cell module. This enables application of more various construction material installation methods than ever, so that many artisans in the field of construction who are skilled in the installation of construction materials can install the solar-cell modules, making it easy to keep those who engage in the installation.

The electricity generation system of the present invention comprises the solar-cell module according to the first or second embodiment and an electric power conversion equipment connected to the solar-cell module. This can provide an electricity generation system having a high quality-reliability.

A specific embodiment of the present invention will be described below with reference to the accompanying drawings.

Figure 2:
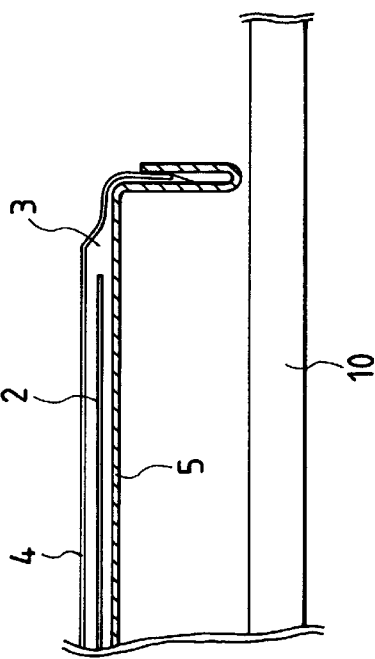
FIG. 2 is a partially enlarged diagrammatic cross-sectional view in the direction vertical to the cross section of the solar-cell module shown in FIG. 1.
Figure 3:
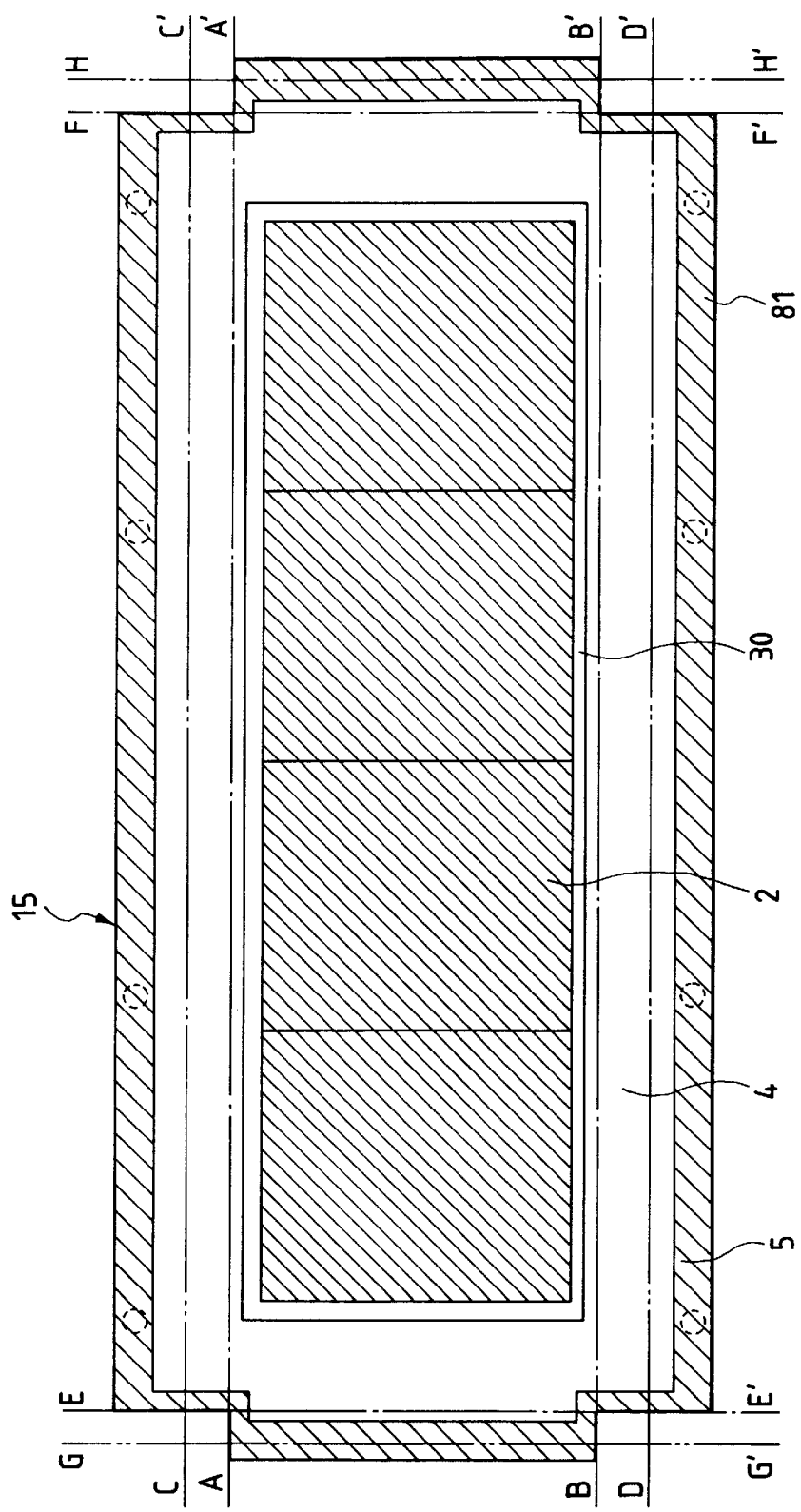
FIG. 3 is a diagrammatic plan view showing how members for making up the solar-cell module shown in FIG. 1 stand superposed.

FIG. 1 cross-sectionally illustrates how a solar-cell module according to an embodiment of the present invention is mounted. FIG. 2 is a partially enlarged cross-sectional view in the direction vertical to the cross section of the one shown in FIG. 1. FIG. 3 is a plan view showing how members for making up the solar-cell module shown in FIG. 1 stand superposed.

The construction of a solar-cell module 1 according to the present embodiment will be described with reference to FIG. 1. In the solar-cell module 1 according to the present embodiment, a photovoltaic device 2 is sealed and fixed with a covering material, transparent resin 3 (and 30 inclusive). On the outermost surface of the light-receiving side, a transparent surface protective film 4 is provided. On the back of these, a reinforcing sheet 5 made of a metal is provided as a back reinforcing sheet. These are bonded to each other in the form of a laminate. The surface protective film 4 is also embraced in the covering material in the sense that it covers the photovoltaic device 2.

In this module, the photovoltaic device 2 is an amorphous silicon photovoltaic device comprising a stainless steel substrate of 125 μm thick and an amorphous silicon semiconductor layer formed thereon. The covering material, transparent resin 3 (and 30) is comprised of EVA resin (ethylene-vinyl acetate copolymer) formed into a sheet of 450 μm thick (each), and is provided on the surface and back of the photovoltaic device 2. The surface protective film 4 is a fluorine resin film of 50 μm thick. The reinforcing sheet 5 is a galvanized steel sheet of 0.4 mm thick. the part showing a characteristic feature of the solar-cell module according to the present embodiment will be described below.

Reference numeral 6 denotes a margin of the transparent resin 3. As can be seen from FIG. 1, this transparent resin 3 is bonded to the reinforcing sheet 5 in such a shape that the thickness of the former at its margin becomes cross-sectionally smaller toward the outer edge, in other words, toward the margin of the reinforcing sheet 5. In addition, a margin 7 of the surface protective film 4 lies at the part where the thickness of the transparent resin 3 at its margin becomes cross-sectionally smaller toward the outer edge. Namely, this region is so constructed that the transparent resin 3 extends more closely to a margin 8 of the reinforcing sheet 5 than the surface protective film 4. This structure can readily be formed by a production process described later.

A marginal region 81 is a partial region of the reinforcing sheet 5, and is a region which lies beyond the margin of the covering material transparent resin 3 and surface protective film 4. A fitting hole (not shown) is provided in this region so that the solar-cell module 1 is set and fixed with, e.g., a bolt 9 at the hole.

The solar-cell module has a first bent portion 11 and a second bent portion 12 in its region extending from the border of the photovoltaic device toward the outer edge. These portions are covered with the covering material, transparent resin 3 and surface protective film 4. At these bent portions, the covering material at these portions is formed in a smaller thickness than that at the part where the photovoltaic device is disposed so that no stress may be applied there when the reinforcing sheet 5 is worked by bending. As a specific example, the thickness of the covering material at the part where the photovoltaic device is disposed is so designed as to be larger by about the thickness of the part 30 of the covering material than the thickness of the covering material at the part where the photovoltaic device is not disposed.

At a terminal lead-out portion of the solar-cell module 1, a terminal lead-out box 13 and a cable 14 led out of the box are provided. These are means through which the electricity outputted from the photovoltaic device 1 is collected.

The solar-cell module set up in this way has the following advantages.

First, the covering material is by no means damaged since the covering material, transparent resin 3 and surface protective film 4, is not provided in the region with which the forming machine comes into contact when the fitting hole is formed at the marginal region 81 of the reinforcing sheet 5. Hence, the covering material by no means begin to come off from any damaged part as the start point. Also, even when any dynamic load, e.g., a mechanical load is applied to the marginal region 81 of the reinforcing sheet 5, this marginal region does not undergo such a mechanical load since the covering material does not lie there. As a result, it can be made very less possible for the covering material to begin to come off.

Since also the margin of the covering material, transparent resin 3 and surface protective film 4, has the shape as described above, it can be made very less possible for the covering material to begin to come off when it undergoes a mechanical load. Moreover, the two bent portions 11 and 12 are provided between plane A where the margin of the covering material lies, i.e., the plane made lower by a terrace, and plane B having a large area where the photovoltaic device 2 is disposed, i.e., the plane made higher by the terrace. Hence, even when any heat such as solar heat is fed to the plane B, the margin of the covering material may hardly be affected by expansion and contraction by that heat. Accordingly, the transparent resin 3 may hardly undergo any peel stress caused by a thermal or mechanical load, so that it can be made very less possible for the covering material to begin to come off.

In addition, even if the covering material has begun to come off from its margin and has further come off, there is a great possibility that the bent portions 11 and 12 serve as a barrier against coming-off to make the covering material stop coming off any longer at that part. In other words, even through the covering material continues to undergo a peel stress to begin to come off and has come off up to the bent portion, such a stress is once released at the bent portion, so that the covering material on the plane B can be prevented from being caused to come off. Moreover, once the peel stress has been released at the bent portion and the covering material has stopped further coming off, a great stress is required in order for it to again begin to come off.

As described above, the solar-cell module according to the present embodiment has only a very small possibility that its covering material comes off up to the part where the photovoltaic device is disposed. This makes it possible to obtain a solar-cell module having a high electrical reliability. The solar-cell module according to the present embodiment is also nice-looking because the plane B where at least the photovoltaic device 2 is mounted and the first bent portion 11 are sealed with the same covering material.

A process for producing the solar-cell module according to the present embodiment is described below. (Step of sealing the photovoltaic device and reinforcing sheet with the covering material) The photovoltaic device, the reinforcing sheet and the covering material are, e.g., as described above, i) an amorphous silicon photovoltaic device comprising a stainless steel substrate of 125 μm thick and an amorphous silicon semiconductor layer formed thereon, ii) a galvanized steel sheet of 0.4 mm thick and iii) a material consisting of EVA resin (ethylene-vinyl acetate copolymer) and fluorine resin film of 50 μm thick, respectively.

FIG. 3 is a plan view showing how these members stand superposed.

On the reinforcing sheet 5, a transparent resin 30 larger by 1 cm outward than the photovoltaic device 2 is placed, and the photovoltaic device 2 (a set of devices) is mounted thereon. On these, a sheet material is placed which is formed by integral lamination of a transparent resin 3 and a resin film 4. This sheet material has the transparent resin 3 and the resin film 4 which are entirely identical in size, and has the shape as shown in FIG. 3. Since the superposed materials having such size and shape are heated, the thickness of the covering material at its region outside the region where the photovoltaic device is disposed is smaller than the thickness of the covering material at its region where the photovoltaic device is disposed. In other words, as is also seen from FIG. 1, the covering material has a thickness which becomes gradually smaller toward the margin of the reinforcing sheet from the region where the photovoltaic device is mounted within the plane B, and has substantially a constant small thickness before it extends to the first bent portion 11.

To make fitting holes (the hole through which the bolt 9 is passed) 15 in the marginal region 81 of the reinforcing sheet 5, i.e., the region shaded in FIG. 3, the size and shape of the sheet material are determined so that a tool as exemplified by a perforating press machine does not come into contact with this sheet material to damage it.

The step of making the holes by means of the tool such as a perforating press machine is a step taken as a final step in the bending steps described later. This step can provide the fitting holes in the marginal region 81 of the solar-cell module in agreement with the size of a stand actually installed.

A step in which the members constituting the solar-cell module are compression-bonded to one another by heating is described below.

Figure 4:
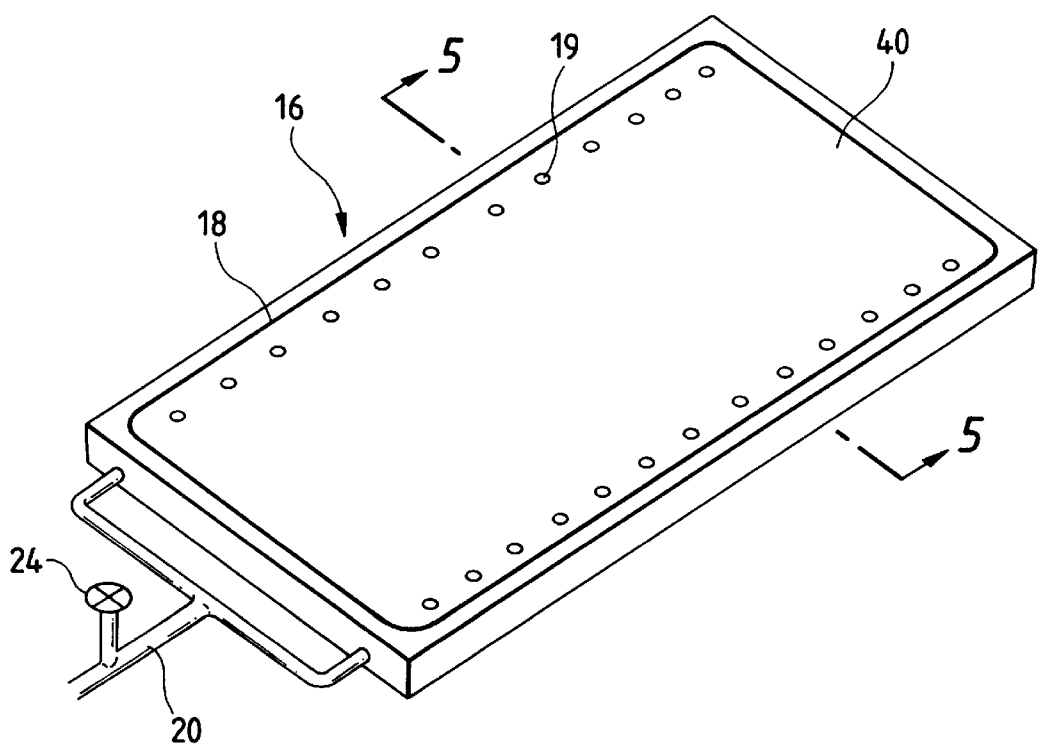
FIG. 4 is a diagrammatic perspective view showing a jig for producing the solar-cell module shown in FIG.
Figure 5:
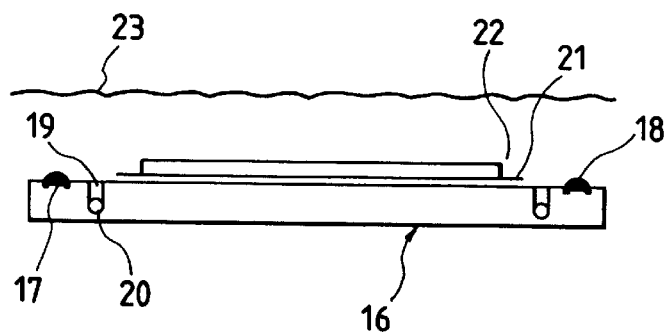
FIG. 5 is a diagrammatic cross-sectional view showing a step for producing the solar-cell module shown in FIG. 1.

FIG. 4 is a diagrammatic perspective view showing a jig for producing the above solar-cell module. FIG. 5 is a diagrammatic cross-sectional view showing how the members for producing the solar-cell module are placed on the jig, and is a cross sectional view along the line 5—5 in FIG. 4. In FIG. 4 the jig, denoted as 16, is formed of a plate made of aluminum, and the members constituting the solar-cell module, stated specifically, the photovoltaic device, those constituting its covering material and so forth are placed thereon when used. Then, on the plate made of aluminum, so as to provide the function as a jig, a groove 17 is so provided as to surround the region where the photovoltaic device and the covering material are placed. An O-ring 18 made of a heat-resistant resin is fitted in the groove. Right on the inside of the O-ring 18, a suction opening 19 is provided for producing a vacuum, which is connected to a pipe 20 and is further connected to a vacuum pump (not shown).

In FIG. 5, reference numerals 16, 17, 18, 19 and 20 correspond to those in FIG. 4, and reference numeral 21 is a release film; 22, a laminate such as a polytetrafluoroethylene (PTTE) and 23, a silicone rubber. The silicone rubber 23 and the release film 21 are used when the laminate 22 is placed on the jig 16.

Using this jig, the solar-cell module is produced in the following way. First, the members prepared as described above are superposed on the top surface 40 of the jig 16 in the following way. Namely, a release PTTE film 21 is first spread over the bottom. This.is spread so that the covering material EVA resin does not protrude and adhere to the jig. Next, the galvanized steel sheet of 0.4 mm thick is placed thereon, the EVA resin formed into a sheet of 450 μm thick is placed thereon, and the amorphous silicon photovoltaic device is further placed thereon. On these members, the sheet material formed by integral lamination of the EVA resin and the fluorine resin film of 50 μm thick is placed. The size and shape of this sheet material have been so determined that the sheet material itself can be disposed at the desired position where it is not damaged by, e.g., the perforating press machine. The members are superposed in this way, and finally a silicone rubber 23 is placed thereon. The silicone rubber 23 has, e.g., such a size that it extends over the suction opening 19. Thus, the superposing of the respective members on the jig is completed.

In this state, the vacuum pump (not shown) is operated and the valve 24 is opened, so that the silicone rubber 23 comes into close contact with the O-ring 18, and a closed space is formed which is defined by the silicone rubber 23, the O-ring 18 and the jig 16, thus-its inside stands vacuum or evacuated. Thus, the reinforcing sheet 5 made of metal, the transparent resin 30, the photovoltaic device 2, the transparent resin 3 and the surface protective film 4 are uniformly pressed against the jig 16 through the silicone rubber 23. The jig 16 kept in such a state is put into a heating furnace while being kept vacuum by continuing operating the vacuum pump. Temperature inside the heating furnace is maintained at a temperature higher than the melting point, glass transition temperature or softening temperature of the EVA resin. In the heating furnace, the covering material is heated to become soft and come to exhibit a sufficient adhesive force until its chemical or physical changes therefor are completed. After lapse of the time for such changes, the jig kept vacuum is taken out of the heating furnace. Then, after it is cooled to room temperature, the vacuum pump is stopped operating, and the silicone rubber 23 is removed to release the members from the vacuum state. Thus, a solar-cell module sealed with the covering material is completed.

The solar-cell module according to the present embodiment is, as can be seen from the foregoing description, completed in such a form that the thickness of the covering material on the reinforcing sheet is about 1 mm at the region where the photovoltaic device is disposed, whereas, at the region on its outside, the thickness is about 500 $\mu$m, the half of the former, and also that, at the margin of the covering material, as cross-sectionally shown in FIGS. 1 and 2, the transparent resin, EVA resin has been flowed outward beyond the resin film surface protective film 4 as a result of heating or heat compression bonding and also has come to have a thickness naturally made smaller toward the outer edge. Hence, its margin is smooth and any peel force may hardly be applied thereto.

On the other hand, hitherto produced have been solar-cell modules so constructed as to be covered with the covering material up to the margin of the reinforcing sheet. Stated specifically, the size and shape of the laminate sheet integrally formed of the transparent resin and the surface protective film are made larger than the reinforcing sheet, in other words, protruded from the reinforcing sheet, in the state of which the photovoltaic device is sealed in the same manner as the above. Then, after sealing, the covering material is cut off at its part protruding from the reinforcing sheet, along the edge of the reinforcing sheet by means of a cutting knife.

In the present embodiment, the step of cutting off the covering material can be omitted, bringing about many advantages such that not only operation steps can be reduced but also there is no danger for operators to cut their fingers on the cutting knife.

(Bending step)

A forming step of working the solar-cell module by bending is described below.

Chain lines and chain double-dotted lines shown in FIG. 3 are bending lines. For example, the solar-cell module is bent along these bending lines by means of a bending machine called a press break, by which the solar-cell module is bent while putting a mold along the chain-line portion.

The solar-cell module having the cross section as shown in FIG. 1 is formed by hill-bending it along chain lines A–A' and B–B' and valley-bending it along chain double-dotted lines C–C' and D–D'. Its remaining two sides as shown in FIG. 2 are bent by hill-bending the module along chain lines E–E' and F–F' and valley-bending it along chain double-dotted lines G–G' and H–H', provided that for the latter's valley bending, that part is folded by 180 degrees so as to be structured as shown in the partial enlarge view of FIG. 2. Thus, the margin of the covering material, transparent resin 3 and surface protective film 4 can be covered with the reinforcing sheet. Accordingly, the margin is kept from any external mechanical load, and the covering material can be made much less possible to come off.

In the above bending step, when, e.g., the module is bent using a bending mold of the bending machine, the covering material may possibly be pressed. However, since the covering material according to the present embodiment is soft or can be kept from rubbing against any machine such as the roll forming machine, the solar-cell module can be formed without problems, i.e., without damaging the covering material.

On the solar-cell module thus formed, holes are finally made using the "perforating press machine", in agreement with the size of a stand having been installed in the field. Here, the "perforating press machine" comes into contact with the marginal region 81 of the working target solar-cell module at a great impact force. In the solar-cell module according to the present embodiment, the module is formed without providing any covering material from the beginning at the contact portion, i.e., the marginal region 81, and hence the covering material is not damaged at all.

The present invention is by no means limited to the embodiment described above. Its constituents and other embodiments are described below.

(Photovoltaic Device)

There are no particular limitations on the photovoltaic device used in the solar-cell module of the present invention. For example, it may include crystalline-silicon photovoltaic devices, polycrystalline-silicon photovoltaic devices, amorphous-silicon photovoltaic devices, copper-indium-selenide photovoltaic devices and compound semiconductor photovoltaic devices. It may preferably be a photovoltaic device having a flexibility, and may particularly preferably be an amorphous-silicon photovoltaic device formed on a stainless steel substrate.

The use of the photovoltaic device having a flexibility can keep the photovoltaic device from breaking even when a curving stress is applied to the solar-cell module when formed by bending. Accordingly, various forming processes can be carried out, making the module adaptable to various forms of installation, thus such a photovoltaic device is preferred.

The photovoltaic device can also be kept from breaking even when a curving stress is applied to the solar-cell module, e.g., a wind pressure is applied or someone steps on it, after the solar-cell module has been installed and fixed.

(Reinforcing Sheet)

There are no particular limitations on the reinforcing sheet of the solar-cell module according to the present invention. When it has light-transmitting properties, it may be provided on the light-receiving side of the photovoltaic device. When it is provided on the non-light-receiving side, one having no light-transmitting properties may be used. It is preferred to use a metallic sheet on the back of the light-receiving side. The use of such a metallic sheet is advantageous as stated below.

The metallic sheet is one of materials most suited for plastic working. Such a technique of plastic working is a technique having long been studied and having been established. Hence, it is very useful because any forming machines for metallic sheets which are conventionally available in variety can be used as they are.

The metallic sheet also has a sufficient mechanical strength, and hence even a solar-cell module alone can be made to have a sufficient structural strength by bending it three-dimensionally into the solar-cell module.

The metallic sheet still also has a flexibility, and hence the solar-cell module can be installed and fixed in a curved state, making the module adaptable to various forms of installation.

Of metallic materials, those having a good weatherability and a good corrosion resistance are preferred. For example, they may include galvanized steel sheets, steel sheets obtained by further coating galvanized steel sheets with a weatherable substance such as fluorine resin or vinyl chloride, and stainless steel sheets.

(Covering Material)

There are no particular limitations on the covering material of the solar-cell module according to the present invention except that it has the function to fix the photovoltaic device to the reinforcing sheet by sealing and has the function to protect the photovoltaic device from severe external environment such as temperature changes, humidity and impact. An elastic and soft resin is preferred because it can be kept from undergoing a mechanical load to break easily. Accordingly, after it has been fixed to the reinforcing sheet by sealing, the reinforcing sheet can be bent.

For example, it may include, as specific materials, polyolefin resins such as ethylene-vinyl acetate copolymer (EVA), ethylene-methyl acrylate copolymer (EMA), ethylene-ethyl acrylate copolymer (EEA) and butyral resin, urethane resin, and silicone resin.

In the case where the reinforcing sheet is provided on the back of the light-receiving side, a transparent film may preferably be used on the surface of the covering material so that the photovoltaic device can be protected from humidity and can be made to become dirty with difficulty. As materials therefor, it may include, e.g., fluorine resins and acrylic resins. In particular, fluorine resins are preferred because of their superior weatherability and stain resistance. Stated specifically, polyvinylidene fluoride resin, polyvinyl fluoride resin and tetrafluoroethylene-ethylene copolymer are available. From the viewpoint of weatherability, polyvinylidene fluoride resin is advantageous, whereas, from the viewpoint of achievement of both weatherability and mechanical strength and also transparency, tetrafluoroethylene-ethylene copolymer is advantageous. When used in combination with the above resin, to improve its adhesion, the adherend surface of the film material may preferably be subjected to treatment such as corona treatment, plasma treatment, ozone treatment, ultraviolet irradiation, electron-ray irradiation or flame treatment.

The covering material may preferably be further incorporated with a fibrous material so that it can be improved in scratch resistance. It may include, as specific fibrous materials, a glass fiber nonwoven fabric and a glass fiber woven fabric.

EXAMPLES

The present invention will be described below by giving Examples. The present invention is by no means limited to these Examples.

Example 1

The solar-cell module in the present Example is a roofing material integral type solar-cell module.

The solar-cell module of the present Example is described with reference to FIGS. 6 and 7. Members not especially described are the same as those described in the above embodiments.

Figure 6:
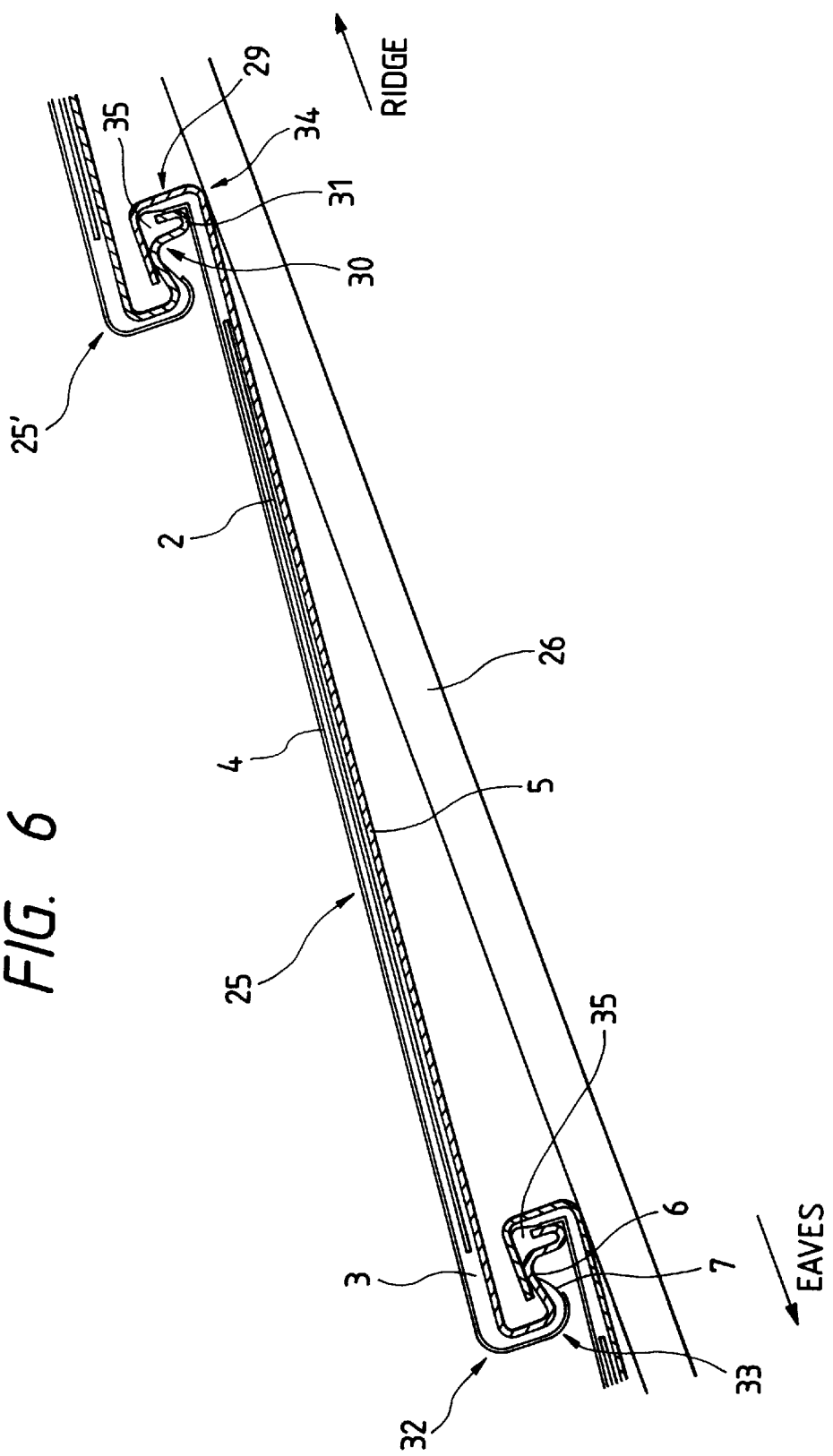
FIG. 6 is a diagrammatic cross-sectional view of a solar-cell m module according to an Example of the present invention.

FIG. 6 is a cross-sectional-view showing how a plurality of solar-cell modules of the present Example are installed in a slope, i.e., in a slant. FIG. 7 is an external perspective view of the solar-cell module of the present Example.

Figure 7:
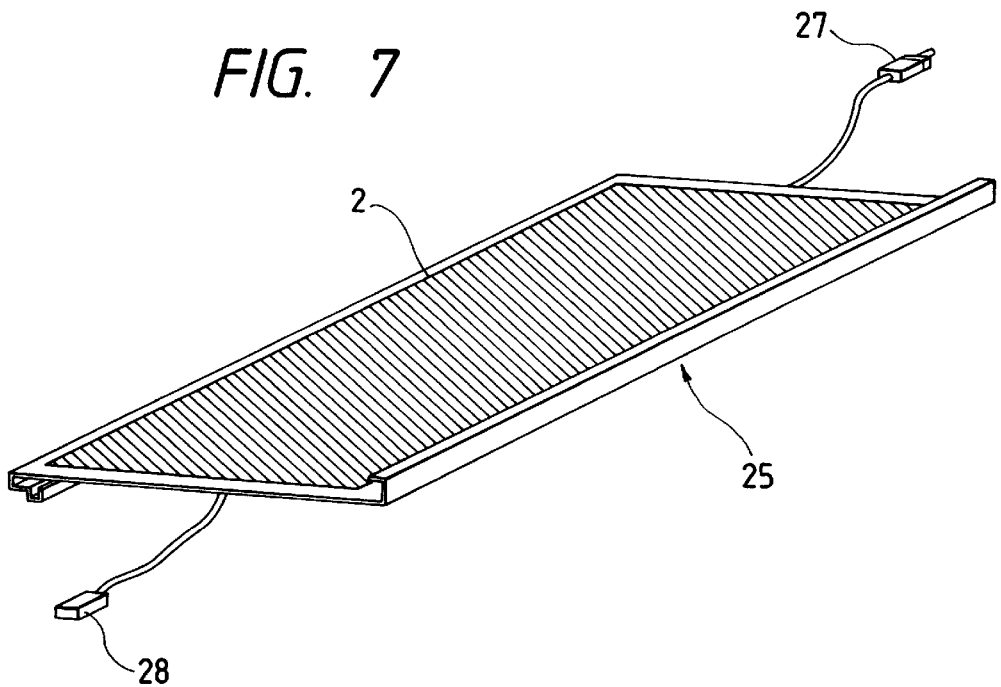
FIG. 7 is a diagrammatic external perspective view of the solar-cell module shown in FIG. 6.

In FIGS. 6 and 7, reference numerals 26 denotes a roofing board, on which a solar-cell modules 25 is fixed at a ridge-side joint 29 by means of a fixing member (not shown). This ridge-side joint 29 is made to engage with an eaves-side joint 30 of another solar-cell module 25' adjoiningly installed on the ridge side. This operation is started on the eaves side and the modules are installed up to the ridge. Reference numerals 27 and 28 in FIG. 7 are connectors, which make electrical interconnection between solar-cell modules which are adjoining laterally.

The joint of the solar-cell module of the present invention is formed by a roll forming machine to have the cross-sectional curved shape as shown in FIG. 6. A foldedly bent portion 31 of the eaves-side joint 30 is also formed by a roll forming machine. It is a characteristic feature of the forming machine that materials can be formed with ease to have such complicated shapes. This foldedly bent portion 31 is used also in conventional roofing materials made of metal. Its space 35 is intentionally formed so that rainwater can be prevented from invading the interior of a house by capillarity. In the solar-cell module 25. or 25' of the present Example, the covering material does not cover the reinforcing sheet 5 at the foldedly bent portion 31. If the covering material covers the reinforcing sheet up to its margin as in conventional cases, the covering material is inevitably very strongly rubbed by rollers of the roll forming machine to become damaged. Besides, a part of the covering material having been damaged and having come off may probably be rolled up in the rollers to cause a trouble. However, since in the solar-cell module 25 or 25' of the present Example the covering material does not extend up to the bent portion 31 as shown in FIG. 6, the module can be formed without problems, i.e., without damaging the covering material, transparent resin 3 and resin film 4. Other bent portions 32, 33 and 34 are bent at an angle of about 90 degrees, which is a relatively large bending radius, and hence working conditions are not so severe as to damage the covering material. The solar-cell modules according to the present Example are also nice-looking because the marginal region of one solar-cell module is covered with the marginal region of another solar-cell module adjoining to each other.

Example 2

The solar-cell module of the present Example is characterized in that it is a roofing material integral type solar-cell module-and also, after the solar-cell module has been installed, the margin of the covering material is covered with a fixing member for fixing the solar-cell module.

The solar-cell module of the present Example is briefly described with reference to FIGS. 8 and 9. Members not especially described are the same as those described in the above embodiments.

Figure 8:
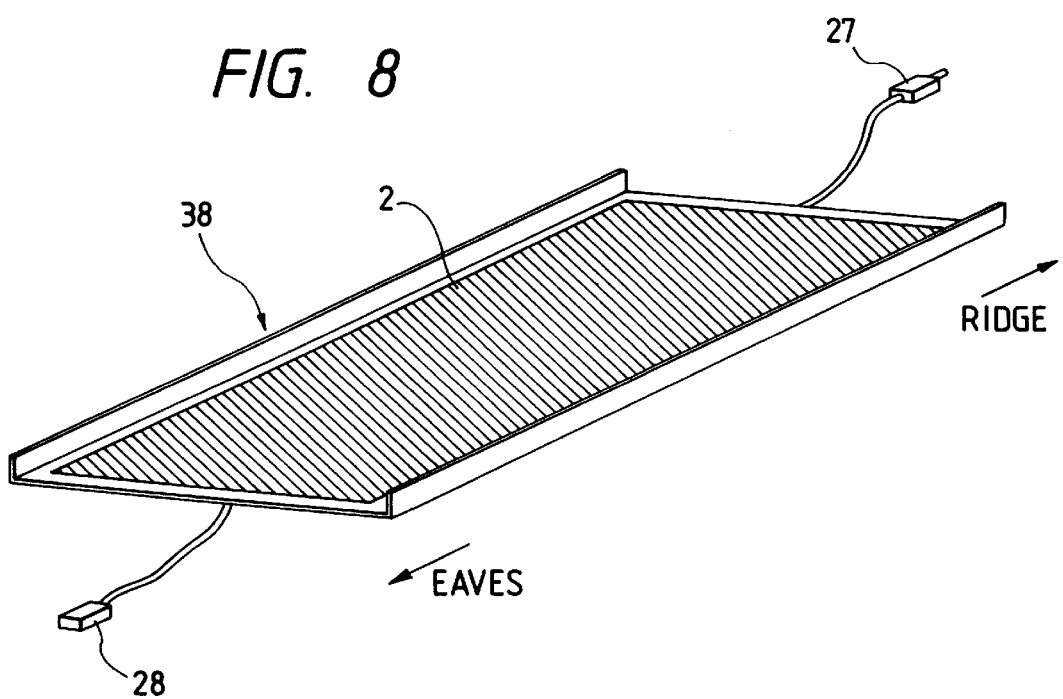
FIG. 8 is a diagrammatic external perspective view of a solar-cell module according to another Example of the present invention.

FIG. 8 is an external perspective view of the solar-cell module according to the present Example. FIG. 9 is a cross-sectional view stepwise showing the manner of fixing two solar-cell modules of the present Example to a roofing board of a roof by means of a fixing member. In the solar-cell module shown in FIG. 8, its lengthwise direction is in agreement with the ridge-to-eaves direction when the module is placed on the roof.

Figure 9A:
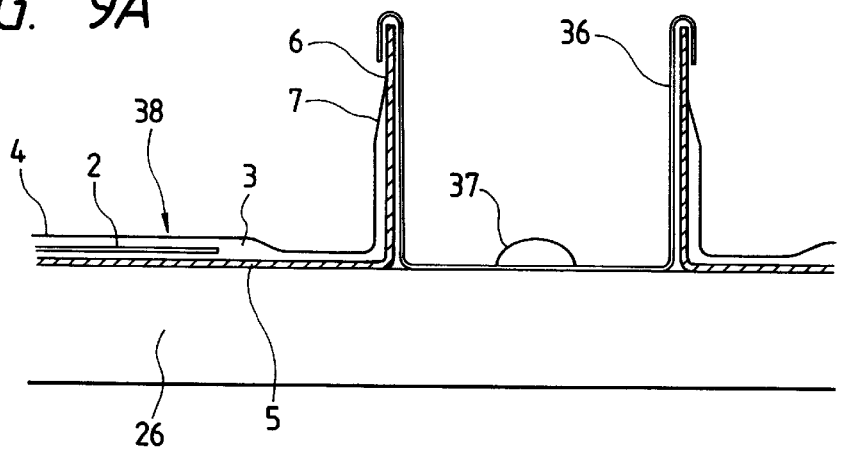
FIG. 9A, FIG. 9B and FIG. 9C are cross-sectional views showing the steps of roofing by using the solar-cell module shown in FIG. 8.
Figure 9B:
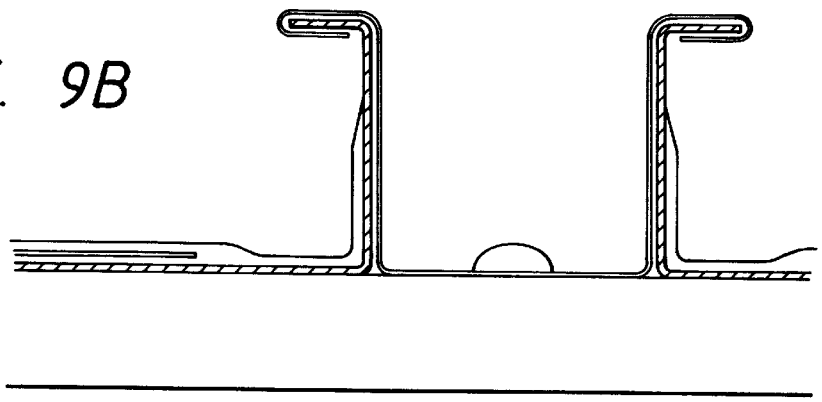
Figure 9C:
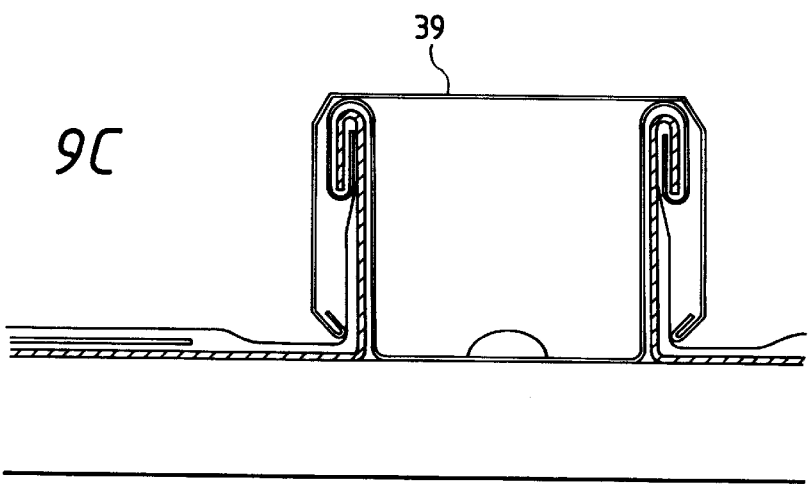

A process of installation is described with reference to FIGS. 9A, 9B, and 9C. A solar-cell module 38 is placed on a roofing board 26, and a fixing member 36 is used at the part adjoining to the solar-cell module. The fixing member 36 holds down the two solar-cell modules simultaneously at their bent portions and fixes them onto the roofing board 26 with a drill screw 37 (FIG. 9A). Next, the fixing member 36 and the reinforcing sheet 5 of each solar-cell module are bent together (FIG. 9B). Then, finally a cap material 39 is fixed with a sealant (FIG. 9C). Being installed in this way, the margin of the covering material of each solar-cell module of the present Example is covered with the fixing member and also joined under pressure. Thus, it was able to obtain a nice-looking roofing material integral type solar-cell module having been made it very less possible for its covering material to begin to come off.

In the present Example, too, the solar-cell modules were formed by means of the roll forming machine. However, since the covering material was not present at the margin of the reinforcing sheet, the covering material was kept from being damaged to come off or the roll forming machine was operable without any trouble.

Example 3

A solar cell module of the present Example is characterized in that a bent portion provided at a margin region of a reinforcing sheet on the ridge-side is not covered with a covering material. Other points than this are the same as those of the solar cell module explained in Example 1.

Figure 10:
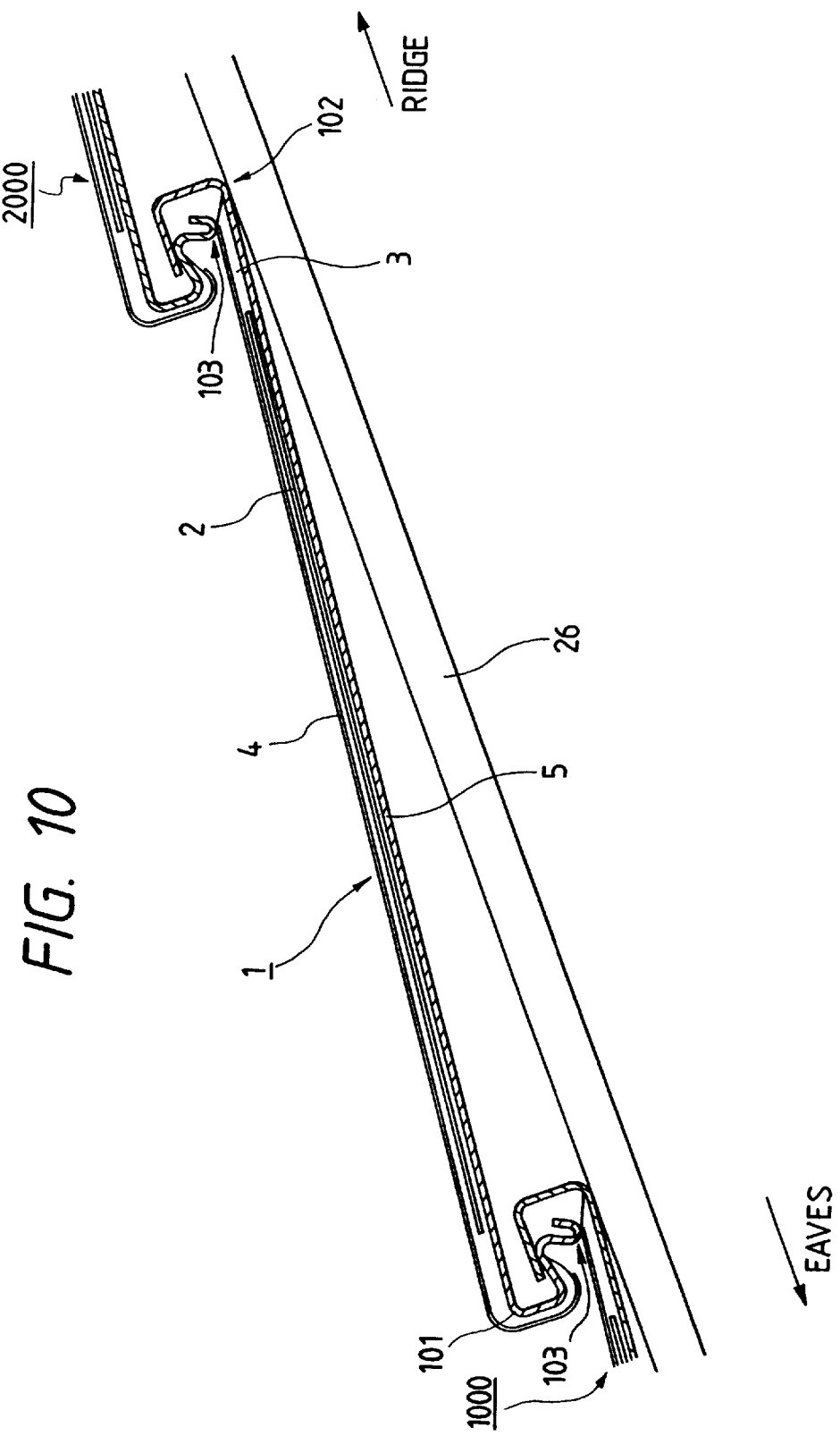
FIG. 10 is a diagrammatic cross-sectional view of a solar-cell module according to another Example of the present invention.

FIG. 10 is a diagrammatic cross-sectional view showing how a plurality of solar cell modules 1000 and 2000 according to present Example are adjoiningly mounted on the roofing board 26 having a slant. In this figure, the right side is a ridge side which is the upper side of the slant and the left side is an eaves side which is the lower side of the slant.

The margin region of the reinforcing sheet 5 on the ridge side has a construction similar to that of the solar cell module of Example 1 shown in FIG. 6. That is, at least the bent portion 101 of the reinforcing sheet 5 at the margin region of the reinforcing sheet 5 on the eaves-side and the photovoltaic device 2 are covered with a covering material comprising the surface protective film 4 and the transparent resin 3.

The other bent portion of the reinforcing sheet 5, i.e., the bent portion 102 of the reinforcing sheet 5 on the ridge side is worked by bending, similarly as explained in Example 1, such that the surface on the side on which the photovoltaic device 2 is provided is made inner.

The margin of the surface protective film 4 constituting the covering material is positioned such that the margin is directly held down by the bent portion 103 of another solar cell module 2000. However, the surface protective film 4 is not provided at the bent portion 102. In addition, the transparent resin 3 constituting the covering material has a thickness made cross-sectionally smaller from the margin of the surface protective film 4 toward the bent portion 102, and the transparent resin 3 is not provided at the bent portion 102.

In the solar cell module according to the present Example, the covering material can be held down by the bent portion 103 of another solar cell module, thereby being able to prevent the covering material from coming off. In addition, since the covering material is not provided at the bent portion 102, the covering material does not come off at the bent portion during bending, resulting in making the bending easier. Further, it is possible that the covering material is prevented from coming off after the reinforcing sheet has been bent. As described above, the solar-cell module of the present invention has been made it very less possible for the covering material to come off from its margin.

Even if the covering material has begun to come off, it has been made hard for the covering material to further come off up to the position where the photovoltaic device is disposed.

Thus, it has become possible to obtain a solar-cell module which may very hardly cause any lowering of electrical performance due to coming-off of the covering material and has a high quality-reliability.

What is claimed is:

1. A solar cell module comprising:
 a photovoltaic device;
 a reinforcing sheet for reinforcing the photovoltaic device the reinforcing sheet having a bent portion in a region extending from a border of the photovoltaic device on a photovoltaic device mounting area to a margin of the reinforcing sheet;
 a covering material for sealing the photovoltaic device on the reinforcing sheet, wherein the covering material covers the photovoltaic device and extends from the border of the photovoltaic device toward the margin of the reinforcing sheet in such a way as to extend over the bent portion and not over the margin of the reinforcing sheet and wherein a thickness of the covering material becomes cross-sectionally smaller in a direction toward the margin of the reinforcing sheet at a portion of the covering material near the margin of the reinforcing sheet; and
 a resin film provided on an outermost surface of the solar cell module in such a way as to cover the covering material except the portion of the covering material near the margin of the reinforcing sheet in which the thickness of the covering material becomes cross-sectionally smaller in a direction toward the margin of the reinforcing sheet.

2. The solar cell module according to claim 1, wherein the covering material is located in such a way that a margin of the covering material is covered with a fixing member for fixing the solar cell module or with a margin of an adjoiningly installed solar cell module.

3. The solar cell module according to claim 1, wherein the margin of the reinforcing sheet is folded by bending the reinforcing sheet to form a folded portion.

4. The solar cell module according to claim 3, wherein the folded portion of the reinforcing sheet covers the margin of the covering material.

5. The solar cell module according to claim 1, wherein the covering material comprises a transparent resin selected from the group consisting of polyolefin resin, urethane resin and silicone resin, the transparent resin sealing the photovoltaic device and bonding it to the reinforcing sheet.

6. The solar cell module according to claim 5, wherein the transparent resin comprises a thermoplastic resin.

7. The solar cell module according to claim 1, wherein the thickness of the covering material at a region outside the border of the photovoltaic device is smaller than the thickness of the covering material at a region where the photovoltaic device is disposed.

8. The solar cell module according to claim 1, wherein the reinforcing sheet is made of metal.

9. The solar cell module according to claim 1, wherein the photovoltaic device is flexible.

10. The solar cell module according to claim 1, wherein the solar cell module is formed integrally with a construction material.

11. An electricity generation system comprising the solar cell module according to claim 1 and electric power conversion equipment connected to the solar cell module.

12. A solar cell module comprising:
a photovoltaic device;
a reinforcing sheet for reinforcing the photovoltaic device, the reinforcing sheet having a region extending from a border of the photovoltaic device on a photovoltaic device mounting area to a margin of the reinforcing sheet;
a covering material for sealing the photovoltaic device on the reinforcing sheet, wherein the covering material covers the photovoltaic device and extends from the border of the photovoltaic device toward the margin of the reinforcing sheet in such a way that the margin of the reinforcing sheet is not covered with the covering material and wherein a thickness of the covering material becomes cross-sectionally smaller in a direction toward the margin of the reinforcing sheet at a portion of the covering material near the margin of the reinforcing sheet; and
a resin film provided on an outermost surface of the solar cell module in such a way as to cover the covering material except the portion of the covering material near the margin of the reinforcing sheet in which the thickness of the covering material becomes cross-sectionally smaller in a direction toward the margin of the reinforcing sheet.

13. The solar cell module according to claim 12, wherein the covering material is located in such a way that a margin of the covering material is covered with a fixing member for fixing the solar cell module or with a margin of an adjoiningly installed solar cell module.

14. The solar cell module according to claim 12, wherein the margin of the reinforcing sheet is folded by bending the reinforcing sheet to form a folded portion.

15. The solar cell module according to claim 14, wherein the folded portion of the reinforcing sheet covers the margin of the covering material.

16. The solar cell module according to claim 12, wherein the covering material comprises a transparent resin selected from the group consisting of polyolefin resin, urethane resin and silicone resin, the transparent resin sealing the photovoltaic device and bonding it to the reinforcing sheet.

17. The solar cell module according to claim 16, wherein the transparent resin comprises a thermoplastic resin.

18. The solar cell module according to claim 12, wherein the thickness of the covering material at a region outside the border of the photovoltaic device is smaller than the thickness of the covering material at a region where the photovoltaic device is disposed.

19. The solar cell module according to claim 13, wherein the reinforcing sheet is made of metal.

20. The solar cell module according to claim 12, wherein the photovoltaic device is flexible.

21. The solar cell module according to claim 12, wherein the solar cell module is formed integrally with a construction material.

22. An electricity generation system comprising the solar cell module according to claim 12 and electric power conversion equipment connected to the solar cell module.

23. A method of installing solar cell modules comprising the steps of:
fixing a solar cell module to a stand or a roofing board by means of a fixing member, wherein the solar cell module comprises
a photovoltaic device;
a reinforcing sheet for reinforcing the photovoltaic device, the reinforcing sheet having a bent portion in a region extending from a border of the photovoltaic device on a photovoltaic device mounting area to a margin of the reinforcing sheet;
a covering material for sealing the photovoltaic device on the reinforcing sheet, wherein the covering material covers the photovoltaic device and extends from the border of the photovoltaic device toward the margin of the reinforcing sheet in such a way as to extend over the bent portion and not over the margin of the reinforcing sheet and wherein a thickness of the covering material becomes cross-sectionally smaller in a direction toward the margin of the reinforcing sheet at a portion of the covering material near the margin of the reinforcing sheet; and
a resin film provided on an outermost surface of the solar cell module in such a way as to cover the covering material except the portion of the covering material near the margin of the reinforcing sheet in which the thickness of the covering material becomes cross-sectionally smaller in a direction toward the margin of the reinforcing sheet; and
joining adjacent solar cell modules to each other utilizing the bent portion of the reinforcing sheet of each solar cell module.

24. The method of installing solar cell modules according to claim 23, wherein the solar cell module is fixed in such a way that a margin of the covering material is covered with a margin of an adjacent solar cell module or with the fixing member.

25. The method of installing solar cell modules according to claim 23, wherein the solar cell module is formed integrally with a construction material.

26. A method of installing solar cell modules comprising the steps of:
fixing a solar cell module to a stand or a roofing board by means of a fixing member, wherein the solar cell module comprises
a photovoltaic device;
a reinforcing sheet for reinforcing the photovoltaic device, the reinforcing sheet having a region extending from a border of the photovoltaic device on a photovoltaic device mounting area to a margin of the reinforcing sheet;
a covering material for sealing the photovoltaic device on the reinforcing sheet, wherein the covering material covers the photovoltaic device and extends from the border of the photovoltaic device toward the margin of the reinforcing sheet in such a way that the margin of the reinforcing sheet is not covered with the covering material and wherein a thickness of the covering material becomes cross-sectionally smaller in a direction toward the margin of the reinforcing sheet at a portion of the covering material near the margin of the reinforcing sheet; and
a resin film provided on an outermost surface of the solar cell module in such a way as to cover the covering material except the portion of the covering material near the margin of the reinforcing sheet in which the thickness of the covering material becomes cross-sectionally smaller in a direction toward the margin of the reinforcing sheet; and
joining adjacent solar cell modules to each other.

27. The method of installing solar cell modules according to claim 26, wherein the solar cell module is fixed in such a way that a margin of the covering material is covered with a margin of an adjacent solar cell module or with the fixing member.

28. The method of installing solar cell modules according to claim 26, wherein the solar cell module is formed integrally with a construction material.

29. A solar cell module comprising:

a substrate;

a photovoltaic device provided on one surface of the substrate;

a covering material covering the one surface of the substrate and the photovoltaic device to an extent that the covering material does not cover an end portion of the one surface of the substrate, wherein the covering material has a portion where a thickness of the covering material becomes cross-sectionally smaller in a direction toward the end portion of the one surface of the substrate; and a resin film covering the photovoltaic device and the covering material to an extent that the resin film does not cover the portion of the covering material where a thickness of the covering material becomes cross-sectionally smaller.

30. The solar cell module according to claim 29, wherein a bent portion is provided in a direction perpendicular to the one surface of the substrate where the substrate, the covering material and the resin film are provided.

* * * * *

UNITED STATES PATENT AND TRADEMARK OFFICE
CERTIFICATE OF CORRECTION

PATENT NO. : 6,218,609 B1
DATED : April 17, 2001
INVENTOR(S) : Masahiro Mori et al.

It is certified that error appears in the above-identified patent and that said Letters Patent is hereby corrected as shown below:

Title page,
Item [56], FOREIGN PATENT DOCUMENTS:
"5-121773    5/1993 (JP)." should be deleted; and
"5-121773  * 4/1998 (JP) ...............H01L/31/042" should read
-- 5-121773  * 5/1993 (JP) ...............H01L/31/042 --.

Column 2,
Line 13, "though" should read -- thought --;
Line 22, "wherein;" should read -- wherein: --;
Line 37, "wherein;" should read -- wherein: --; and
Line 48, "invention-also" should read -- invention also --.

Column 3,
Line 2, "FIG." should read -- FIG. 1. --;
Line 6, "m" should be deleted;
Line 27, "conditions" should read -- conditional --; and
Line 27, "that;" should read -- that: --.

Column 4,
Line 14, "through" should read -- though --;
Line 28, "conditions" should read -- conditional --; and
Line 28, "that;" should read -- that: --.

Column 5,
Line 49, "elasticity." should read -- elasticity. This --;
Line 50, "(new paragraph) This can" should read -- (no new paragraph) can --;
Line 65, "modules" should read -- module --.

Column 6,
Line 3, "less" should read -- little --;
Line 43, "break" should read -- breaking --; and
Line 49, "can not" should read -- -cannot-.

Column 7,
Line 38, "part" should read -- part of --;
Line 38, "material" should read -- material that --;
Line 40, "damaged" should read -- damaged so as --;
Line 48, "part" should read -- part of --; and.
Line 48, "material" should read -- material that --.

UNITED STATES PATENT AND TRADEMARK OFFICE
CERTIFICATE OF CORRECTION

PATENT NO.      : 6,218,609 B1
DATED           : April 17, 2001
INVENTOR(S)     : Masahiro Mori et al.

It is certified that error appears in the above-identified patent and that said Letters Patent is hereby corrected as shown below:

Column 8,
Line 7, "always not" should read -- not always --.
Line 21, "employs" should read -- employ --.

Column 9,
Line 61, "can not" should read -- cannot --.

Column 10,
Line 64, "can not" should read -- cannot --.

Column 11,
Line 14, "can," should read -- can --; and
Line 41, "with" should be deleted.

Column 12,
Line 22, "thick. the" should read -- thick. (new paragraph) The --.

Column 13,
Line 1, "with-which" should read -- with which --;
Line 4, "begin" should read -- begins --;
Line 31, "coming-off' should read -- coming off --;
Line 33, "through" should read -- though --;
Line 51, "(Step" should read -- (new paragraph) (Step --; and
Line 53, "The" should read -- (new paragraph) The --.

Column 14,
Line 58, "This. is" should read -- This is --.

Column 15,
Line 10, "thus-its" should read -- thus its --; and
Line 21, "come" should read -- comes --.

Column 16,
Line 9, "partial" should read -- partially --; and
Line 9, "enlarge" should read -- enlarged --.

Column 17,
Line 49, "adherend" should read -- adherent --.

UNITED STATES PATENT AND TRADEMARK OFFICE
CERTIFICATE OF CORRECTION

PATENT NO. : 6,218,609 B1
DATED : April 17, 2001
INVENTOR(S) : Masahiro Mori et al.

It is certified that error appears in the above-identified patent and that said Letters Patent is hereby corrected as shown below:

Column 18,
Line 5, "sectional-view" should read -- sectional view --;
Line 9, "numerals" should read -- numeral --;
Line 10, "modules" should read -- module --; and
Line 54, "module-and" should read -- module and --.

Column 19,
Line 17, "it" should be deleted.

Column 20,
Line 5, "it" should be deleted.
Line 17, "device" should read -- device, --

Signed and Sealed this

Eleventh Day of June, 2002

Attest:

Attesting Officer

JAMES E. ROGAN
Director of the United States Patent and Trademark Office